United States Patent [19]

Kim et al.

[11] Patent Number: 5,736,276

[45] Date of Patent: Apr. 7, 1998

[54] METHOD FOR FABRICATING PHASE INVERTED MASK

[75] Inventors: Young Gwan Kim, Chungcheongbuk-do; Hyun Kyu Han, Seoul, both of Rep. of Korea

[73] Assignee: LG Semicon Co., Ltd., Chungcheongbuk-do, Rep. of Korea

[21] Appl. No.: 657,610

[22] Filed: May 31, 1996

[30] Foreign Application Priority Data

Dec. 26, 1995 [KR] Rep. of Korea .................. 56314/1995

[51] Int. Cl.$^6$ .................................................. G03F 9/00
[52] U.S. Cl. ........................................ 430/5; 430/322
[58] Field of Search .................................. 430/5, 321, 322, 430/396; 156/643

[56] References Cited

U.S. PATENT DOCUMENTS 5,208,125   5/1993   Lowrey et al. ............................ 430/5
5,460,908  10/1995   Reinberg ................................ 430/321

OTHER PUBLICATIONS

Kenji Nakagawa et al., "Mask Pattern Designing for Phase-Shift Lithography", International Electron Devices Meeting, 51, 3.1.1–3.1.4 (1991).

*Primary Examiner*—S. Rosasco
*Attorney, Agent, or Firm*—Morgan, Lewis and Bockius LLP

[57] ABSTRACT

A method of fabricating a phase inverted mask comprising the steps of forming a shielding layer pattern on a substrate, injecting oxygen ions into a surface of the shielding layer pattern, and converting the shielding layer pattern having the oxygen ions injected therein into an oxidation layer to thereby form a phase inverted layer.

10 Claims, 2 Drawing Sheets

METHOD FOR FABRICATING PHASE INVERTED MASK

BACKGROUND OF THE INVENTION

1. Field of the Invention

The present invention relates to a phase inverted mask and, more particularly, to a method of fabricating a phase inverted mask in which oxygen is injected onto a surface of a pattern of a shielding layer to thereby form a phase inverted layer.

2. Description of the Related Art

Generally, in photolithography used in manufacturing semiconductor devices, an exposing process is performed on a wafer, using a mask having a light-transmitting portion and a light-shielding portion.

There are fourteen important steps in photolithography associated with higher packing densities of semiconductor devices. Forming nodes is one of these. Capacitance per cell varies with the shape and size of the nodes. At a higher density of the semiconductor device, capacitance per cell is required to be similar to that in the previous generation but, at the same time, the node size must be reduced. For this reason, it is very important to precisely define the node pattern as desired. However, with the conventional mask simply having a light-transmitting portion and light-shielding portion, a desired node pattern cannot be precisely obtained due to the reduction of resolution by light interference at the edges of the light-shielding portion.

In order to avoid this problem, a phase inverted mask for compensating for reduction in resolution due to light interference at the edges of the light-shielding portion has been proposed. One such phase inverted mask is known as a rim-type mask. The steps associated with the manufacture of a phase inverted rim-type mask are shown in FIGS. 1A–1D.

First of all, a metal layer is formed on a substrate 10 and then patterned to form a metal shielding layer 11. A phase inverted layer (or phase transition layer) 12 is then formed on metal shielding layer 11 and substrate 10. A photoresist layer 13 is coated on phase inverted layer 12 and then patterned. Using photoresist layer 13 as a mask, an unused portion of phase inverted layer 12 is removed. Finally, photoresist layer 13 itself is removed.

With this rim-type phase inverted mask, the reduction of resolution due to light interference at the edges of metal layer 11 acting as the shielding area is compensated for by phase inverted layer 12. This accurately exposes only the light-transmitting area, sharply increasing resolution.

However, the method of fabricating the phase inverted mask includes a number of steps such as forming a predetermined pattern of the mask, forming a phase inverted layer thereon, forming a mask layer using an electron beam, and removing an unused portion of the phase inverted layer using the mask layer. In addition, due to unevenness of the metal shielding layer, planarization is not performed smoothly when the metal shielding layer is covered with the phase inverted layer. This decreases the uniformity of the thickness of the phase inverted layer as well as resolution.

SUMMARY OF THE INVENTION

Therefore, it is an object of the present invention to provide a method of fabricating a phase inverted mask which constitutes an easy manufacturing process and results in a uniform phase inverted layer. Additional objects and advantages of the invention will be set forth in the description which follows or will be obvious from the description or may be learned by practice of the invention.

To accomplish the objects of the present invention, a method of fabricating a phase inverted mask is provided comprising the steps of forming a shielding layer pattern on a transparent substrate, injecting oxygen ions into a surface of the shielding layer pattern, and converting the shielding layer pattern having the oxygen ions injected therein into an oxidation layer to thereby form a phase inverted layer.

It is to be understood that both the foregoing general description and the following detailed description are exemplary and explanatory only. They should not be considered to be restrictive of the invention, as claimed.

DETAILED DESCRIPTION OF PREFERRED EMBODIMENT

A preferred embodiment of the present invention will now be described with reference to the attached drawings.

Figure 1A:
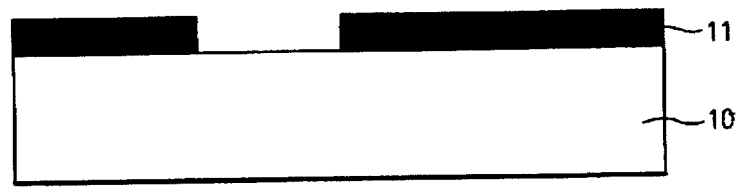
FIGS. 1A–1D show sequential steps of fabricating a conventional phase inverted mask.
Figure 1B:
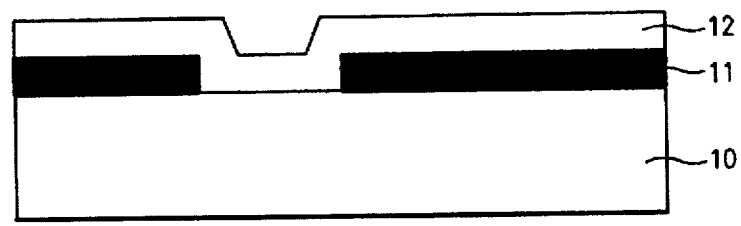
Figure 1C:
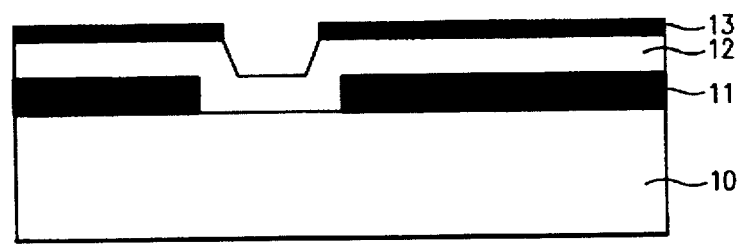
Figure 1D:
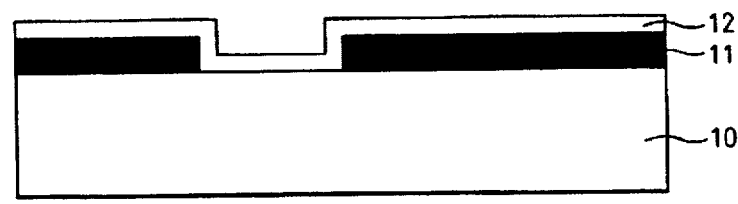
Figure 2A:
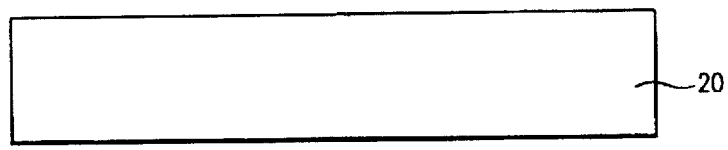
FIGS. 2A–2E show sequential steps of fabricating a phase inverted mask in accordance with the present invention.
Figure 2B:
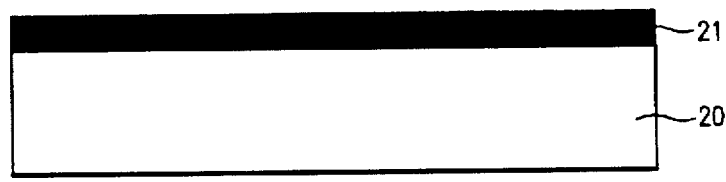
Figure 2C:
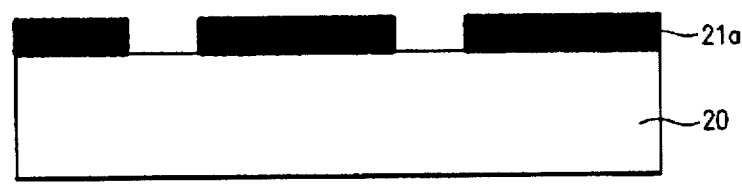
Figure 2D:
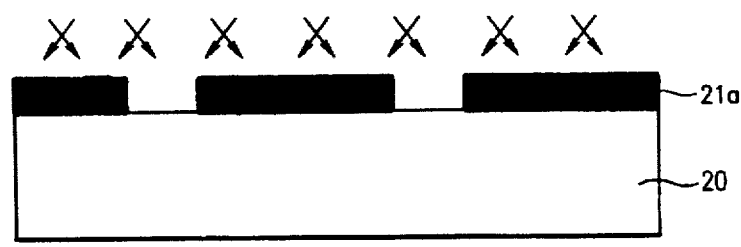
Figure 2E:
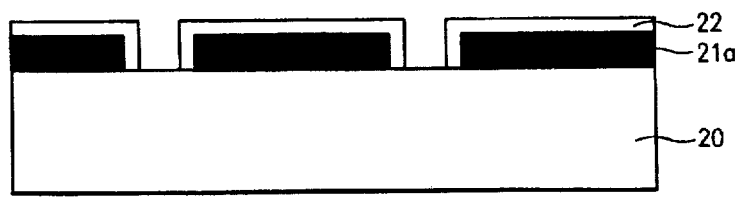

As shown in FIG. 2A, a transparent substrate 20 for a mask is prepared. As shown in FIG. 2B, a Zn metal layer 21 is deposited on transparent substrate 20. As shown in FIG. 2C deposited metal layer 21 is patterned to form a metal shielding layer 21a. Turning to FIG. 2D, a tilt injection of oxygen ions is performed, as indicated by reference numeral 22. As shown in FIG. 2E, the surface on the metal shielding layer 21a formed by oxygen ion injection is oxidized to become phase inverted layer 22 through heat treatment.

In the phase inverted mask fabrication of the present invention, the phase inverted layer 22 is formed through oxygen ion injection and heat treatment after the metal shielding layer 21a (mask) is formed on the substrate 20. This simplifies fabrication of the mask and reduces its cost, at least as compared with the conventional technique.

When the phase inverted layer 22 is formed with the metal oxidation layer through heat treatment after oxygen ions are injected onto the surface of the metal shielding layer 21a, as in the present invention, the phase inverted layer 22 can be obtained easily at a low temperature and in a short time. The resulting uniformity of the metal oxidation layer is excellent on the surface of the metal shielding layer 21a. This enables a uniform phase inverted layer, sharply enhancing the resolution of the pattern.

Those skilled in the art will recognize that various modifications and variations of the present invention can be made without departing from the spirit or scope of the invention. Other embodiments of the invention will be apparent to those skilled in the art from consideration of the specification and practice of the invention. It is intended that the specification and examples be considered as exemplary only, with the true scope and spirit of the invention being indicated by the appended claims and their equivalents.

What is claimed is:

1. A method of fabricating a phase inverted mask comprising the steps of:

forming a shielding layer pattern on a transparent substrate;

injecting oxygen ions into a surface of the shielding layer pattern; and converting the shielding layer pattern having the oxygen ions injected therein into an oxidation layer to thereby form a phase inverted layer.

2. The method of fabricating a phase inverted mask as claimed in claim 1, wherein the step of injecting oxygen ions into the surface of the shielding layer pattern includes the step of performing a tilt injection of oxygen ions into the surface of the shielding layer pattern.

3. The method of fabricating a phase inverted mask as claimed in claim 1, wherein the shielding layer pattern comprises a Zn metal layer.

4. The method of fabricating a phase inverted mask as claimed in claim 1, wherein the step of forming the phase inverted layer includes the step of heat treating the shielding layer pattern after injecting oxygen ions into the surface of the shielding layer pattern.

5. A method of fabricating a phase inverted mask comprising the steps of:

forming a shielding layer on a substrate; and forming a phase inverted layer on the shielding layer using an oxygen ion injection process.

6. The method of fabricating a phase inverted mask as claimed in claim 5, wherein the step of forming the phase inverted layer comprises the steps of injecting oxygen ions into a surface of the shielding layer and, thereafter, performing a heat treatment process.

7. The method of fabricating a phase inverted mask as claimed in claim 6, wherein the step of injecting oxygen ions into the surface of the shielding layer comprises the step of performing a tilt injection of oxygen ions into the surface of the shielding layer.

8. The method of fabricating a phase inverted mask as claimed in claim 5, wherein the step of forming the shielding layer comprises the steps of depositing a metal layer on the substrate.

9. The method of fabricating a phase of inverted mask as claimed in claim 8, further comprising the step of patterning the metal layer to form a shielding layer pattern.

10. The method of fabricating a phase inverted mask as claimed in claim 5, wherein the substrate is a transparent substrate.

* * * * *